(12) United States Patent
Tetelbaum et al.

(10) Patent No.: US 6,442,737 B1
(45) Date of Patent: Aug. 27, 2002

(54) METHOD OF GENERATING AN OPTIMAL CLOCK BUFFER SET FOR MINIMIZING CLOCK SKEW IN BALANCED CLOCK TREES

(75) Inventors: Alexander Tetelbaum, Hayward; Ruben Molina, Jr., San Ramon, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/876,736

(22) Filed: Jun. 6, 2001

(51) Int. Cl.⁷ .............................................. G06F 17/50
(52) U.S. Cl. .................. 716/5; 716/6; 716/10
(58) Field of Search ................... 716/5, 6, 10

(56) References Cited

U.S. PATENT DOCUMENTS

| | | | | |
|---|---|---|---|---|
| 5,774,371 A | * | 6/1998 | Kawakami ................... | 716/10 |
| 5,896,299 A | * | 4/1999 | Ginetti et al. ................... | 716/6 |
| 5,974,245 A | * | 10/1999 | Li et al. ........................ | 716/10 |
| 6,286,128 B1 | * | 9/2001 | Pileggi et al. ................. | 716/10 |
| 6,397,374 B1 | * | 5/2002 | Pasqualini ..................... | 716/6 |

\* cited by examiner

*Primary Examiner*—Trong Phan
(74) *Attorney, Agent, or Firm*—Fitch, Even, Tabin & Flannery

(57) ABSTRACT

The present invention has application to final balancing of an initial balanced clock tree. In one aspect of the invention, a minimum set of clock buffer delays is generated to reduce clock skew to within a selected skew limit for each level of a balanced clock tree. In one embodiment, the difference between the optimum delay and the clock buffer delay selected from the minimum set of clock buffer delays for each clock buffer in the balanced clock tree is less than or equal to the selected skew limit. In one such embodiment, a method of balancing a clock tree includes the steps of receiving as input a minimum buffer delay, a maximum level skew limit, and a selected skew limit; generating a minimum set of clock buffer delays for replacing at least one clock buffer in the balanced clock tree with a clock buffer delay selected from the minimum set of clock buffer delays such that the difference between the optimum delay and the clock buffer delay is less than or equal to the selected skew limit; and generating as output the minimum set of clock buffer delays.

8 Claims, 2 Drawing Sheets

METHOD OF GENERATING AN OPTIMAL CLOCK BUFFER SET FOR MINIMIZING CLOCK SKEW IN BALANCED CLOCK TREES

BACKGROUND OF THE INVENTION

The present invention relates generally to design tools for integrated circuits. More specifically, but without limitation thereto, the present invention relates to a method of finding a minimum set of clock buffer delays for a balanced clock tree to reduce clock skew below a selected skew limit.

SUMMARY OF THE INVENTION

The present invention has application to final balancing of an initial balanced clock tree.

In one aspect of the invention, a minimum set of clock buffer delays is generated to reduce clock skew to within a selected skew limit for each clock buffer in a balanced clock tree. In one embodiment, the difference between the optimum delay and the clock buffer delay selected from the minimum set of clock buffer delays for each clock buffer in the balanced clock tree is less than or equal to the selected skew limit. In one such embodiment, a method of generating a minimum set of clock buffer delays for balancing a clock tree includes the steps of receiving as input a minimum buffer delay, a maximum level skew limit, and a selected skew limit; generating a minimum set of clock buffer delays such that the difference between the optimum delay and one of the clock buffer delays is less than or equal to the selected skew limit for each clock buffer in the balanced clock tree; and generating as output the minimum set of clock buffer delays.

In another embodiment, a computer program product for balancing a clock tree may be implemented by a computer to perform the following functions: receiving as input a minimum buffer delay, a maximum level skew limit, and a selected skew limit; generating a minimum set of clock buffer delays such that the difference between the optimum delay and one of the clock buffer delays is less than or equal to the selected skew limit for each clock buffer in the balanced clock tree; and generating as output the minimum set of clock buffer delays.

BRIEF DESCRIPTION OF THE DRAWINGS

The present invention is illustrated by way of example and not limitation in the accompanying figures, in which like references indicate similar elements, and wherein.

DESCRIPTION OF THE EMBODIMENTS

Integrated circuits typically include blocks or multiple circuit elements such as flip-flops. The circuit elements are generally synchronized by a common clock signal from clock buffer cells. The clock buffer cells are typically arranged in a balanced clock tree. A balanced clock tree is constructed in a hierarchy of buffer levels, and each buffer level contains one or more partitions of clock buffers. The top buffer level is the clock driver level, which contains a driver driven by a system clock. The next buffer level is the clock repeater level, which contains clock repeaters driven by the clock drivers. The remaining lower buffer levels contain clock buffers down to the lowest level of the clock tree, which contains the clocked circuit elements.

In typical approaches to balanced clock buffer placement, only one type of buffer cell is used at each level of the balanced clock tree, so that all the buffers on each level of the clock tree have the same delay. Generally, the clock buffer delay is the minimum possible delay.

The present invention has application to final balancing of an initial balanced clock tree.

In one aspect of the invention, a minimum set of clock buffer delays is generated to reduce clock skew to within a selected skew limit for each level of a balanced clock tree. In addition to the minimum clock buffer delay, it is possible to make clock buffer delays having longer delays than the minimum clock buffer delay to replace clock buffers in each level of the clock tree to reduce clock skew. A minimum number of such clock buffer delays designed to reduce the clock skew below a selected skew limit for any clock tree design has applications in integrated circuit design that may incidentally reduce the expense involved in the design and maintenance of each new clock buffer delay. In one embodiment, the difference between the optimum delay and the clock buffer delay selected from the minimum set of clock buffer delays for each clock buffer in the balanced clock tree is less than or equal to the selected skew limit. In one such embodiment, a method of generating a minimum set of clock buffer delays for balancing a clock tree includes the steps of receiving as input a minimum buffer delay, a maximum level skew limit, and a selected skew limit; generating a minimum set of clock buffer delays such that the difference between the optimum delay and one of the clock buffer delays is less than or equal to the selected skew limit for each clock buffer in the balanced clock tree; and generating as output the minimum set of clock buffer delays.

Figure 1:
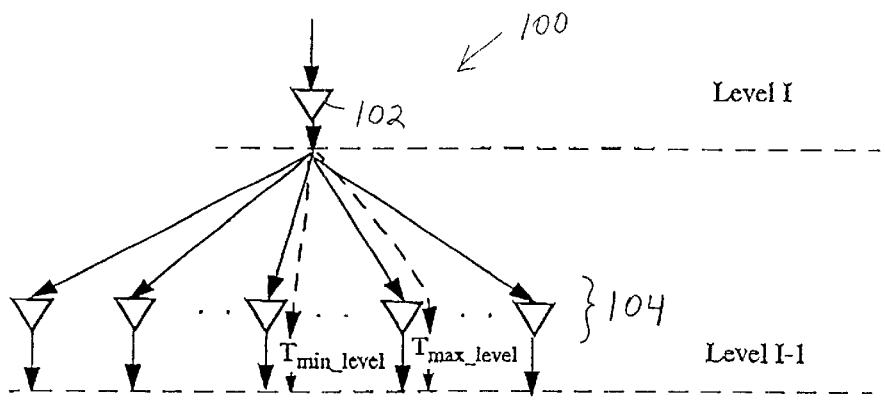
FIG. 1 is a diagram of a portion of a balanced clock tree of the prior art.

FIG. 1 is a diagram of a portion 100 of a hierarchical balanced clock tree in a typical integrated circuit design. Shown in FIG. 1 are a clock buffer 102 in a level I of the clock tree and clock buffers 104 in a level I-1 of the clock tree.

In a typical balanced clock tree design, an initial clock tree is built by commercially available cell placement tools using clock buffers having a minimum internal delay $D_{MIN}$, for example, 250 ps. Minimum delay clock buffers are used to minimize the clock tree insertion delay $T_{MAX}$ for the path $P_{MAX}$ having the longest insertion delay. The initial clock tree has a clock skew of $S_{INIT}$ that does not exceed a maximum skew limit of $S_{MAX}$ for the path $P_{MAX}$, that is, $$S_{INIT} = T_{MAX} - T_{MIN} \leq S_{MAX} \quad (1)$$

where $T_{MIN}$ is the clock tree insertion delay for the path $P_{MIN}$ having the shortest insertion delay. A typical value for $P_{MAX}$ is 1000 ps.

The clock tree typically has several levels of clock buffers, usually in the range between three and ten. The clock skew $S_{INIT\_LEVEL}$ at any level of the clock tree usually does not exceed a maximum level skew limit $S_{MAX\_LEVEL}$, that is, $$S_{INIT\_LEVEL} = T_{MAX\_LEVEL} - T_{MIN\_LEVEL} \leq S_{MAX\_LEVEL} \quad (2)$$

for level I-1 and all other levels of the clock tree. A typical value for $S_{MAX\_LEVEL}$ is less than 500 ps. $T_{MAX\_LEVEL}$ and $T_{MIN\_LEVEL}$ are the maximum and minimum delays at a given level of the clock tree, respectively.

For the path $P_{MIN}$ having the shortest insertion delay, some of the clock buffers may be replaced by clock buffers having internal delays longer than $D_{MIN}$ to reduce the clock skew $S_{INIT}$. Replacing the clock buffers to reduce the clock skew $S_{INIT}$ requires a set of clock buffers having internal delays greater than $D_{MIN}$.

The desired set of replacement clock buffers has a minimum number of clock buffers having different internal delays, and the skew S of the final clock tree is no greater than a selected skew limit $S_{LIMIT}$ for the clock tree, that is, $$S < S_{LIMIT} \quad (3)$$

if the conditions expressed in the relations (1) and (2) are satisfied.

The set of replacement clock buffers should also satisfy different values of the maximum clock skew $S_{LIMIT}$ for the clock tree and different values of $S_{MAX}$, $S_{MAX\_LEVEL}$, $S_{LIMIT}$, and $D_{MIN}$.

For example, if a clock buffer of a path P of he initial clock tree having an internal delay $T_{INIT}$ that is less than $T_{MAX}$ is replaced with a buffer that has an internal delay of $D_{BUF}$ that is greater than $D_{MIN}$, then the new insertion delay is given by:

$$T_{NEW} = T_{INIT} + \Delta T \quad (4)$$

where $\Delta T$ is the additional delay of the replacement buffer given by:

$$\Delta T_{NEW} = D_{BUF} - D_{MIN} \quad (5)$$

The replacement buffer results in the desired reduction in clock skew if the following relation holds:

$$|T_{MAX} - T_{NEW}| \leq S_{LIMIT} \quad (6)$$

which may be rewritten as:

$$|T_{MAX} - T_{INIT} - D_{DBUF} + D_{MIN}| \leq S_{LIMIT} \quad (7)$$

For the minimum delay path $P_{MIN}$, the relation (7) may be expressed as:

$$|S_{INIT} - D_{DBUF} + D_{MIN}| \leq S_{LIMIT} \quad (9)$$

or $$|S_{INIT} - \Delta T| \leq S_{LIMIT} \quad (10)$$

relations (9) and (10) may be rewritten for any level in the clock tree as:

$$|S_{INIT\_LEVEL} - D_{DBUF} + D_{MIN}| \leq S_{LIMIT} \quad (11)$$

or $$|S_{INIT\_LEVEL} - \Delta T| \leq S_{LIMIT} \quad (12)$$

Relation (12) may be expressed verbally as follows: the difference between the optimum delay to add to an initial path to minimize the clock skew and an actual delay that may be added to reduce the clock skew by replacing the clock buffer in a given level must not exceed the maximum clock skew limit for the clock tree. Ideally, the set of replacement clock buffers required to minimize the clock skew should have a minimum number of corresponding delay values to simplify the cell library and the cell placement.

Figure 2:
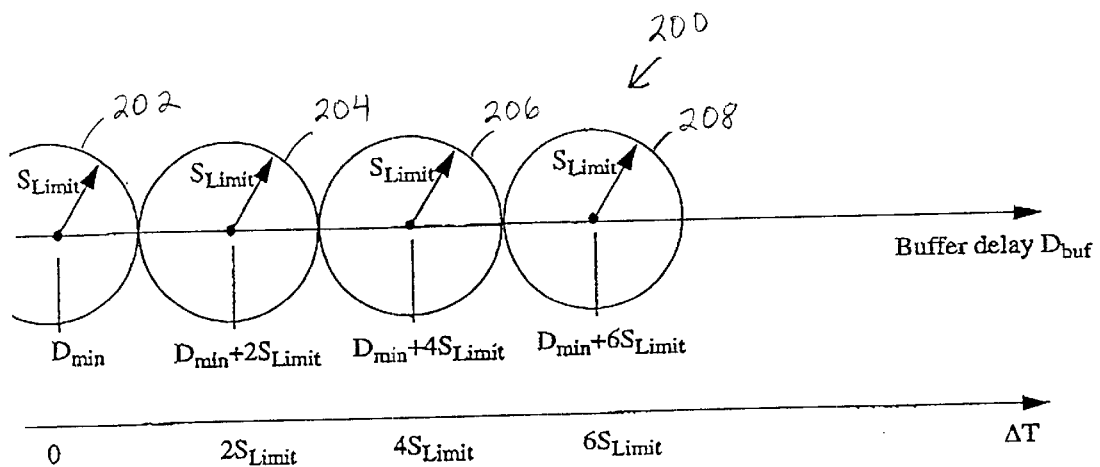
FIG. 2 is a diagram illustrating a method for generating a minimum set of clock buffer delays according to an embodiment of the present invention.

FIG. 2 is a diagram illustrating a method for generating a minimum set of clock buffer delays 200 for balancing the clock tree of FIG. 1 according to an embodiment of the present invention. Shown in FIG. 2 are a set of delay values for clock buffers 202, 204, 206, and 208. The first clock buffer 202 has the minimum internal delay $D_{MIN}$, which is sufficient for any clock skew S less than $S_{LIMIT}$. The second clock buffer 204 has an internal delay of $D_{MIN} + 2*S_{LIMIT}$, which is sufficient for any clock skew S less than $3*S_{LIMIT}$. The third clock buffer 206 has an internal delay of $D_{MIN} + 4*S_{LIMIT}$, which is sufficient for any clock skew S less than $5*S_{LIMIT}$. The fourth clock buffer 208 has an internal delay of $D_{MIN} + 6*S_{LIMIT}$, which is sufficient for any clock skew S less than $7*S_{LIMIT}$, and so on. The minimum number of clock buffer delays required to balance any clock tree therefore depends on the values of the maximum level skew $S_{MAX\_LEVEL}$, the selected skew limit $S_{LIMIT}$, and the minimum buffer delay $D_{MIN}$. These values may be used to determine the minimum number of clock buffer delays needed to balance any clock tree design to within the selected skew limit. The minimum set of clock buffer delays may then be saved in a cell library according to well known techniques. The method described above may be implemented in a flowchart to find the minimum set of clock buffer delays as follows.

Figure 3:
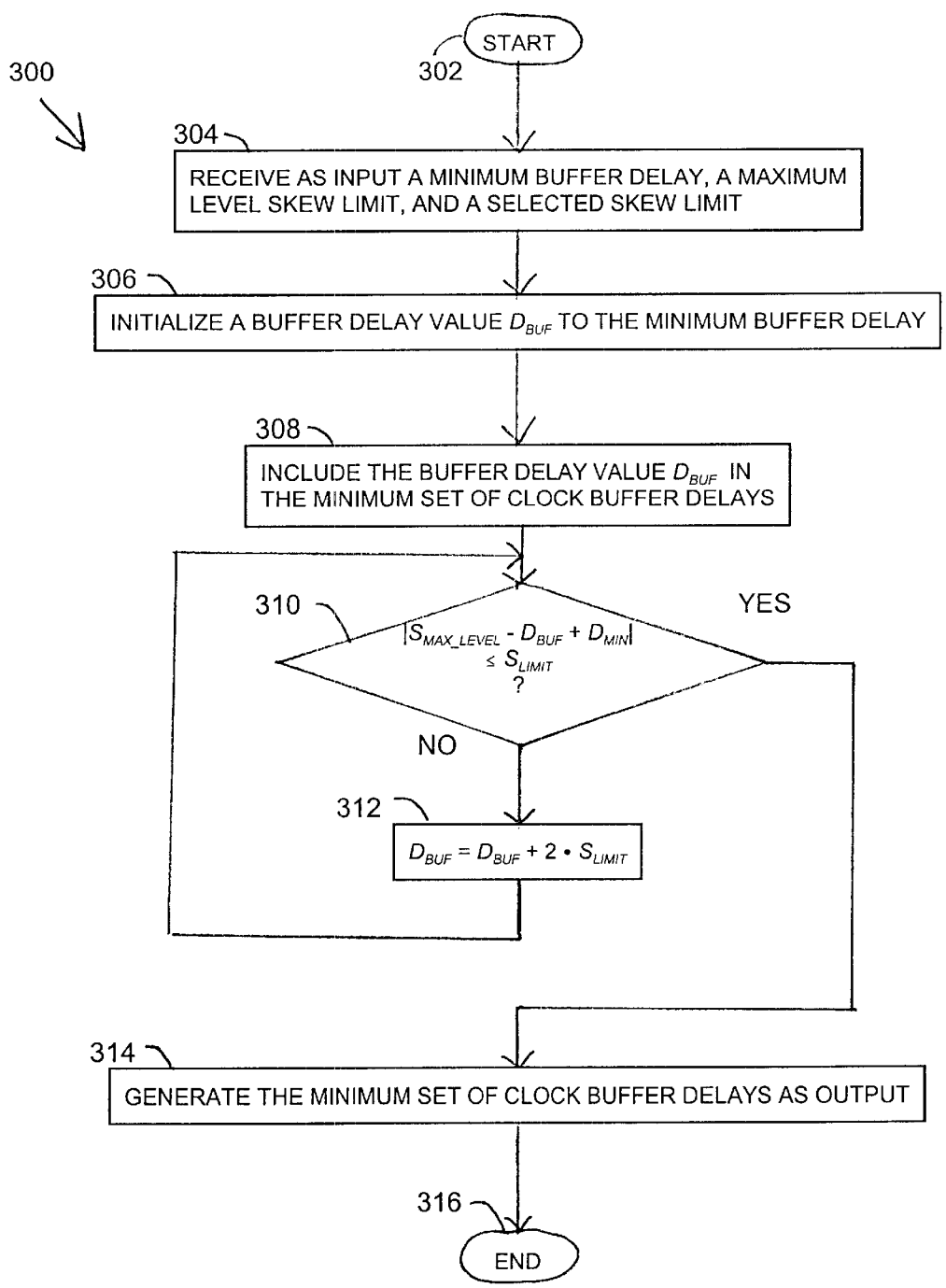
FIG. 3 is a flowchart of the method illustrated in FIG. 2.

FIG. 3 is a flowchart of the method illustrated in FIG. 2.

Step 302 is the entry point of the flowchart 300.

In step 304, a minimum buffer delay, a maximum level skew limit, and a selected skew limit is received as input.

In step 306, a buffer delay value $D_{BUF}$ is initialized to the minimum buffer delay;

In step 308, the buffer delay value $D_{BUF}$ is included in the minimum set of clock buffer delays.

In step 310, if the difference between the delay value $D_{BUF}$ minus the minimum clock buffer delay and the maximum level skew limit is less than or equal to the selected skew limit, then processing continues from step 314.

In step 312, the buffer delay value $D_{BUF}$ is incremented by twice the selected skew limit, and processing continues from step 308.

In step 314, the minimum set of clock buffer delays is generated as output to a cell library.

Step 316 is the exit point for the flowchart 300.

The following examples illustrate the application of the method of the flowchart 300 to various values of the maximum level skew $S_{MAXLEVEL}$, the selected skew limit $S_{LIMIT}$, and the minimum buffer delay $D_{MIN}$:

EXAMPLE 1

$S_{MAX\_LEVEL}$=500 ps, $S_{LIMIT}$=100 ps, $D_{MIN}$=250 ps: {250, 450, 650}=3 buffers

EXAMPLE 2

$S_{MAXLEVEL}$=500 ps, $S_{LIMIT}$=75 ps, $D_{MIN}$=250 ps: {250, 400, 550, 700}=4 buffers

EXAMPLE 3

$S_{MAX\_LEVEL}$=500 ps, $S_{LIMIT}$=50 ps, $D_{MIN}$=250 ps: {250, 350, 450, 550, 650, 750}=6 buffers

EXAMPLE 4

$S_{MAX\_LEVEL}$=500 ps, $S_{LIMIT}$=25 ps, $D_{MIN}$=250 ps: {250, 300, 350, 400, 450, 500, 550, 600, 650, 700, 750}=11 buffers Although the method illustrated by the flowchart 300 has been described and shown with reference to specific steps performed in a specific order, these steps may be combined, sub-divided, or reordered without departing from the scope of the claims. Unless specifically indicated herein, the order and grouping of steps is not a limitation of the present invention.

The method of generating a minimum set of clock buffer delays illustrated by the flowchart 300 above may be embodied in a computer program product and implemented by a computer according to well known programming techniques to perform the following functions: receiving as input a minimum buffer delay, a maximum level skew limit, and a selected skew limit; generating a minimum set of clock buffer delays for replacing at least one clock buffer in the balanced clock tree with a clock buffer delay selected from the minimum set of clock buffer delays such that the difference between the optimum delay and the clock buffer delay is less than the selected skew limit; and generating as output the minimum set of clock buffer delays.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of generating a minimum set of delays for balancing a clock tree comprising the steps of:
   (a) receiving as input a minimum buffer delay, a maximum level skew limit, and a selected skew limit;
   (b) generating a minimum set of clock buffer delays such that the difference between an optimum delay and one of the clock buffer delays is less than or equal to the selected skew limit for each clock buffer in the initial balanced clock tree; and
   (c) generating as output the minimum set of clock buffer delays.

2. The method of claim 1 wherein step (b) comprises including the minimum buffer delay in the minimum set of clock buffer delays.

3. The method of claim 1 wherein step (b) comprises calculating each of the minimum set of clock buffer delays substantially equal to the sum of the minimum buffer delay and an integer multiple of two times the selected skew limit.

4. The method of claim 1 wherein step (b) further comprises the steps of:
   (b1) initializing a buffer delay value $D_{BUF}$ to the minimum buffer delay;
   (b2) including the buffer delay value $D_{BUF}$ in the minimum set of clock buffer delays;
   (b3) if the difference between the delay value $D_{BUF}$ minus the minimum clock buffer delay and the maximum level skew limit is less than or equal to the selected skew limit, then continuing from step (d); otherwise
   (b4) incrementing the buffer delay value $D_{BUF}$ by twice the selected skew limit and continuing from step (b2).

5. A computer program product comprising:
   a medium for embodying a computer program for input to a computer; and
   a computer program embodied in the medium for causing the computer to perform the following functions:
   (a) receiving as input a minimum buffer delay, a maximum level skew limit, and a selected skew limit;
   (b) generating a minimum set of clock buffer delays such that the difference between the optimum delay and one of the clock buffer delays is less than or equal to the selected skew limit for each clock buffer in the initial balanced clock tree; and
   (c) generating as output the minimum set of clock buffer delays.

6. The computer program product of claim 5 wherein step (b) comprises including the minimum buffer delay in the minimum set of clock buffer delays.

7. The computer program product of claim 5 wherein step (b) comprises calculating each of the minimum set of clock buffer delays substantially equal to the sum of the minimum buffer delay and an integer multiple of two times the selected skew limit.

8. The computer program product of claim 5 wherein step (b) further comprises the steps of:
   (b1) initializing a buffer delay value $D_{BUF}$ to the minimum buffer delay;
   (b2) including the buffer delay value $D_{BUF}$ in the minimum set of clock buffer delays;
   (b3) if the difference between the delay value $D_{BUF}$ minus the minimum clock buffer delay and the maximum level skew limit is less than or equal to the selected skew limit, then continuing from step (d); otherwise
   (b4) incrementing the buffer delay value $D_{BUF}$ by twice the selected skew limit and continuing from step (b2).

\* \* \* \* \*